SANDWICH-STRUCTURE-TYPE ALLOYED SEMICONDUCTOR ELEMENT

Filed May 15, 1968

INVENTOR.
HIROO YONEZU

BY

Hopgood & Calimafde
ATTORNEYS

United States Patent Office 3,544,856
Patented Dec. 1, 1970

3,544,856
SANDWICH-STRUCTURE-TYPE ALLOYED SEMICONDUCTOR ELEMENT

Hiroo Yonezu, Tokyo, Japan, assignor to Nippon Electric Company, Limited, Tokyo, Japan, an organization of Japan Filed May 15, 1968, Ser. No. 729,279
Claims priority, application Japan, May 19, 1967, 42/31,824
Int. Cl. H01l 9/10
U.S. Cl. 317—234 9 Claims

ABSTRACT OF THE DISCLOSURE

A semiconductor device is described which is of the sandwich structure type having an alloy PN junction. A sintered layer of a metallic material is placed on one side of a semiconductor material to provide a selective shaping of the PN junction and the ohmic contact made thereto with the result that a tunnel diode may be formed with low resistance and low inductance.

Figure 1A:
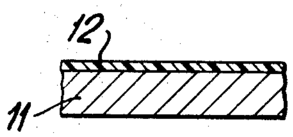

This invention relates to a semiconductor element of sandwich-type structure, in which a glass layer lies between two layers of a semiconductor substance.

As conventional semiconductor elements of sandwich-type structure, two sorts of structures, that is, semiconductor substance - glass - semiconductor substance and metal-glass-semiconductor substance, have been known. In the former, when part of the glass layer is removed and an alloy material is inserted into the removed portion and thereafter alloyed with each of the two semiconductors, alloy portions of almost the same area are formed between the semiconductor and the alloy material. When a PN junction is to be made by the alloy method on either semiconductor, therefore, the junction diameter cannot be easily controlled. Furthermore, when the alloy portion forming a PN junction is etched to reduce the junction diameter as in case of the Esaki diode, the alloy portion forming no PN junction and located on the opposite side is also reduced, with the result of an increase in the series resistance and inductance and deterioration of the electric characteristics of the element. In the latter sandwich structure, i.e. the metal-glass-semiconductor structure involves a reduction in the alloy portion on the semiconductor surface since the alloy material is drawn to the metal side during the alloying. The size of the alloy portion in this latter structure cannot easily be controlled. When the prior art sandwich structure is cut into the specified dimensions in the subsequent process, the cutter would be choked with metallic dust.

It is therefore an object of this invention to remove the abovementioned defects and to provide an alloyed semiconductor element sandwich structure, wherein the alloyed portion size can be easily controlled.

It is a further object of this invention to provide a method of making an alloyed semiconductor element structure.

These objects are accomplished by my invention which is described as follows in conjunction with the drawings, wherein:

FIGS. 1(*a*) to (*e*) are cross-sectional views of the element in the steps of manufacture, for explaining an embodiment of this invention; and FIGS. 2(*a*) and (*b*) are cross-sectional views of the semiconductor element, for demonstrating one embodiment of this invention.

According to this invention, a semiconductor element of the following sandwich structure is obtained: A first semiconductor substance, a glass layer, a sintered layer of a metal such as nickel, gold, or copper which can easily adhere to both the glass and semiconductor substance, and a second semiconductor substance, these being laid upon one another in this order.

My invention further provides a method of manufacturing a semiconductor element and comprises the steps of coating one surface of a first semiconductor substance with a glass layer, depositing such a metal as nickel, gold, copper, etc. on one surface of a second semiconductor substance by means plating or evaporation to form a metallic layer, which is then burnt in to form a sintered metallic layer, followed by coating the sintered metallic layer with a glass layer, combining the two semiconductor substances with each other by joining together the respective glass layers to form a sandwich structure of first semiconductor substance-glass layer-sintered metallic layer-second semiconductor substance, and thereafter laying an alloying material between the first and second semiconductor substances.

In the semiconductor element according to this invention, the alloying effect at the first semiconductor substance is different from that at the sintered layer. Therefore, sizes of the alloy portions at the first and second semiconductor substances can be controlled through conditions of the sintered layer. In detail, by choosing a metal forming the sintered layer, or by controlling the sintered layer film thickness, sintering temperature, sintering time, etc. in case the metal is the same, the alloyed area of the respective semiconductor substance and the alloying material can be easily controlled.

With reference to the drawings, an embodiment of this invention will be described hereunder.

Figure 1B:
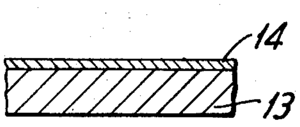
Figure 1C:
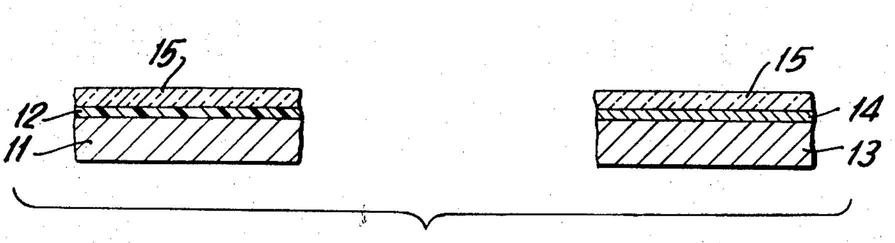
Figure 1D:
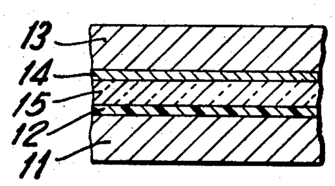
Figure 1E:
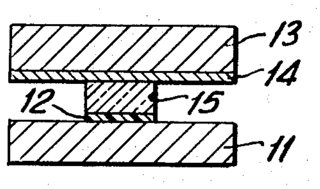

In FIG. 1*a*, lead oxide 12, which can improve the adhesion between a glass layer and germanium, is deposited on the germanium single crystal piece 11. Lead oxide 12 of 1500 A. is evaporated to the germanium single crystal piece 11, and then heated in the air at 500° C. for two minutes to form an oxide layer on the germanium single crystal piece. FIG. 1*b* shows a germanium single crystal piece 13 with sintered layer 14 which will later face with the germanium piece 12 over a glass layer of sandwich structure. This is made as follows: Nonelectrolytic nickel plating solution "Sumer" (trade name) made by Japan Kanigen Company, a corporation of Japan, is kept at 80° C. Germanium monocrystal piece 13 is dipped in this solution for one minute to be plated with nickel of 3,000 A. thick. In the hydrogen atmosphere, it is then heated for 10 seconds at 350° C., which is below the eutectic temperature, to sinter the nickel and germanium, thereby forming a sintered layer 14. In the air, it is heated to form an oxide layer. The sintered layer was as deep as approximately 1 $\mu$. Thereafter, as shown in FIG. 1*c*, #7052 Kovarseal glass powder 15, made by Corning Glass Mfg., Co. of U.S.A., which has been suspended in a mixed solution of ethyl acetate and isopropyl alcohol, is sedimented in a centrifugal separator on the surfaces of the germanium single crystal pieces of which have been subjected to the above-mentioned two sorts of treatments. Germanium single crystal piece 13 with the sintered layer 14 is then heated at 850° C. for five minutes so that the glass powder may adhere tightly to the sintered layer 14. Thereafter, these two germanium single crystal pieces are laid on each other in such a manner that the surfaces of the glass powder are fired at 750°–800° C. for ten minutes in an atmosphere whose pressure has been reduced to $10^{-4}$ mm. Hg to obtain a sandwich structure as shown in FIG. 1*d* in which a glass layer 15 is formed. The thickness of the glass layer 15 was approximately 100 microns The germanium single crystal pieces of the sandwich structure thus obtained is ultrasonically cut into pieces of 0.4 mm. each. The glass portion is etched in a hydrofluoric acid for one minute, and thereafter the piece is dipped in a glacial acetic acid for one minute to remove fluoride of lead and washed with water. The resultant piece is shown in FIG. 1*e*.

Figure 2A:
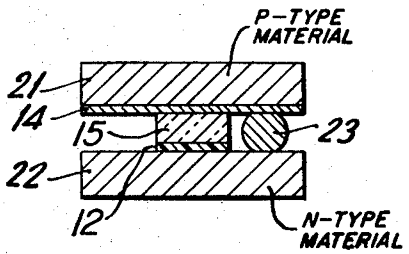
Figure 2B:
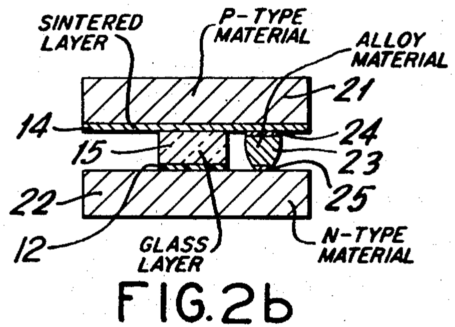

Referring too FIG. 2*a*, most preferred embodiment of this invention will be described, wherein an Esaki diode is produced by use of the piece explained in FIG. 1. As the semiconductor single crystal piece to be provided with the sintered layer, N-type germanium single crystal piece 21 containing arsenic of $2\times10^{19}$ (atom/cc.) is used. As another semiconductor crystal piece, P-type germanium single crystal piece 22 containing gallium of $6\times10^{19}$ (atom/cc.) is used. According to the processes mentioned with reference to FIGS. 1*a–e*, the sandwich structure is formed. Then, an indium ball 23 of 60 microns in radius containing 1% of arsenic is inserted into the portion where glass has been etched away. Thereafter, alloying is obtained by placing the structure for 14 seconds at 420° C. in a nitrogen atmosphere. The result is shown in FIG. 2*b*. Alloy portion 24 with the nickel-sintered layer 14 becomes as wide as approx. 50 microns in radius, while the alloy portion with the P-type germanium single crystal piece, i.e. the PN junction portion 25 has the dimension of approx. 20 microns in radius. The obtained diode has such voltage to current characteristics as has been conventionally obtained.

In the above-mentioned embodiment, it is needless to say that the semiconductor 21 with the sintered layer of FIG. 2*b* is not limited to N-type germanium single crystal, and that the opposite semiconductor substance 22 is also not limited to P-type germanium single crystal. In case of an Esaki diode a semiconductor substance with a sintered layer may be made from N-type germanium, while various semiconductor substances such as P-type gallium arsenide, P-type gallium antimonide, etc. are possible as the opposite semiconductor forming the PN junction. Metal of the sintered layer 14 is not limited to the above-mentioned nickel. Various other metals including gold, silver, copper, etc. can be used by being deposited in the form of a thin film on the surface through non-electrolytic plating, electrolytic plating, evaporation, or the like and then by being sintered. Referring to FIG. 2*b*, wherein the result obtained in the above embodiment is shown, alloy portion 24 between the sintered layer 14 and the alloy ball 23 is larger than the alloy portion 25 between the semiconductor crystal 22 and the alloy ball 23. In an Esaki diode, a PN junction is realized in a small junction portion 25. In practice, it is required for the Esaki diode that the PN junction diameter should be less than 10 microns, though this depends upon the current. The junction diameter may be reduced by means of etching. If the PN junction diameter at the alloying face is large, a long time is required to reduce it to the predetermined dimension. In prior art sandwich structure, the alloy portions 24 and 25 would be almost equal to each other in size and etching to reduce the alloyed PN junction diameter to the desired size would correspondingly decrease the metallic alloy junction, with the result of a great increase in the series resistance and inductance which in an Esaki diode are important factors affecting its characteristics. In this invention, the PN junction is small after the alloying, and the opposite alloy portion 24 is large. As a result, slight etching is needed to establish the rated current for the diode and the fine stick-like form of the alloy ball as well as an increase in the series resistance and the inductance are avoided. Moreover, the change in shape of the alloy ball due to alloying can be controlled by choosing the kind of metal and shape of the sintered layer, resistance and inductance can be controlled. Furthermore, by selecting the sintering conditions of the sintered layer 14, i.e. the sintering temperature and the sintering time, the above characteristics can be also controlled.

Lead oxide, which is used for the purpose of improving the adhesion between the semiconductor substance and the glass in the above-mentioned embodiment of this invention, promotes the oxidization of the semiconductor substance in an oxidizing atmosphere at a lower temrpeature than where no lead oxide is provided and strengthens the adhesion between the semiconductor substance and the glass. Lead oxide may be provided on the other semiconductor substance having a sintered layer; this is optional, however, since the semiconductor substance provided with the sintered layer, includes an oxide of nickel layer which is easily formed and adheres to the glass closely. As the substitute for the lead oxide, a substance which chemically combines with the semiconductor substance to form a glass layer is preferred. Halogenides of lead, zinc, cadmium, and tin, or alkali metal, or alkaline earth metal oxidized in the air can be used in place of lead oxide.

Where the film of deposited nickel for forming a sintered metallic layer is too thin, it is absorbed into the semiconductor substance. Where too thick, meanwhile, it leaves a nonsintered portion. Its suitable thickness is, therefore, approximately from 500 angstroms to 5 microns. It is desirable to sinter the nickel film with germanium at a temperaurte as low as possible in order to prevent degeneration in the final property of element, and besides it is necessary to choose such temperature and time as would not reduce the mechanical strength. If the temperature is higher than the eutectic temperature, a recrystallized layer would grow and depending upon the material used, a PN junction would be formed. Accordingly, it is preferred to sinter for approx. 5 sec. to 10 min. at such a temperature lower than the eutectic temperature as would make it possible to obtain the desired mechanical strength. In the embodiment, nickel has been used as a sintering metal, because it is easily formed by means of non-electrolytic plating and is practically useful. But such metals as gold, copper, etc., which can be easily nonelectrolytically plated or easily evaporated, are suitable substitutes for nickel, as they could closely adhere to both the semiconductor substance and glass.

Because the sintered layer is in intimate contact with the alloy, the layer may be provided on each of the semiconductor substances to obtain almost equal alloy area respectively, with the sintered layer being used as a resistor. When this sintered layer is used in a semiconductor element having PN junction as shown in the above embodiment, however, it should be provided only to the semiconductor substance in which the alloy area is to be enlarged by virtue of the desired element characteristics, irrespective of the conductivity type of the semiconductor substance.

In the above-mentioned embodiment, this invention has been described in reference to the Esaki diode of sandwich structure. But this invention can be also applied for making other elements than that of sandwich structure, for which silicon or other known semiconductor substances is used.

I claim:

1. An alloyed semiconductor sandwich structure comprising a first piece of semiconductor material of a first conductivity type, a second piece of semiconductor material of a second conductivity type opposite said first conductivity type, a glass layer interposed between said first and second semiconductor pieces, an alloy material joined between the pieces of semiconductor material forming an ohmic contact to the one having adhered thereto the metal layer and a PN junction with the other, and a sintered metallic layer interposed between and adhering to said glass layer and one of said first and second semiconductor pieces.

2. The device as recited in claim 1, wherein said sintered layer has a thickness from about 500 A. to 5 microns.

3. The device as recited in claim 2 wherein said sintered layer is made of nickel.

4. The device as recited in claim 1 wherein said sintered layer is made of a material selected from the group consisting of nickel, gold, silver and copper.

5. The device as recited in claim 4 wherein said sintered layer has a thickness from about 500 A. to 5 microns.

6. The device as recited in claim 1, further including an insulator layer of preselected thickness placed between said glass layer and the other of said first and second semiconductor pieces.

7. The device as recited in claim 6 wherein said insulator layer has a thickness of the order of 1500 A.

8. The device as recited in claim 6 wherein said insulator layer is made of a substance selected from the group consisting of lead oxide, halogenides of lead, zinc, cadmium, tin, alkali metal and alkaline earth metal.

9. The device as recited in claim 6 wherein said insulator layer is made of lead oxide.

References Cited

UNITED STATES PATENTS

| | | | |
|---|---|---|---|
| 3,025,439 | 3/1962 | Anderson | 317—240 |
| 3,212,160 | 10/1965 | Dale et al. | 29—25.3 |
| 3,240,571 | 3/1966 | Michelitsch | 29—195 |
| 3,266,137 | 8/1966 | De Mille et al. | 29—473.1 |
| 3,358,158 | 12/1967 | Tiemann | 307—88.5 |
| 3,361,592 | 1/1968 | Quetsch et al. | 117—212 |
| 3,380,812 | 4/1968 | Kamoshita et al. | 29—182.5 |

JERRY R. CRAIG, Primary Examiner

U.S. Cl. X.R.

148—177